(12) United States Patent
Wang et al.

(10) Patent No.: US 10,666,066 B2
(45) Date of Patent: May 26, 2020

(54) DIFFERENTIAL VOLTAGE MEASUREMENT DEVICE

(71) Applicant: Yazaki Corporation, Tokyo (JP)

(72) Inventors: Jian Wang, Shizuoka (JP); Hironao Fujii, Shizuoka (JP); Kei Matsumoto, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 428 days.

(21) Appl. No.: 15/383,820

(22) Filed: Dec. 19, 2016

(65) Prior Publication Data
US 2017/0187201 A1    Jun. 29, 2017

(30) Foreign Application Priority Data

Dec. 24, 2015  (JP) ................... 2015-251744
Nov. 16, 2016  (JP) ................... 2016-223051

(51) Int. Cl.
*H02J 7/00*        (2006.01)
*G01R 31/389*   (2019.01)
(Continued)

(52) U.S. Cl.
CPC ............ *H02J 7/0021* (2013.01); *B60L 50/50* (2019.02); *B60L 58/10* (2019.02); *G01R 19/0084* (2013.01); *G01R 19/10* (2013.01); *G01R 31/389* (2019.01); *G01R 31/3835* (2019.01); *H02J 7/0047* (2013.01); *H02J 7/0068* (2013.01); *B60L 2240/547* (2013.01); *G01R 31/374* (2019.01); *G01R 31/396* (2019.01); *H02J 7/0048* (2020.01); *H02J 7/345* (2013.01);
(Continued)

(58) Field of Classification Search
CPC .. H02J 7/007; G01R 31/3679; G01R 31/3696
USPC ........................................................ 320/134
See application file for complete search history.

(56) References Cited

U.S. PATENT DOCUMENTS 6,957,910 B1 * 10/2005 Wan .................. G01K 7/01
                                                        327/512
8,773,893 B2    7/2014 Daudelin et al.
(Continued)

FOREIGN PATENT DOCUMENTS

CN    103378722 A    10/2013
CN    104170251 A    11/2014
(Continued)

OTHER PUBLICATIONS

Chinese Office Action for the related Chinese Patent Application No. 201611216014.2 dated Feb. 15, 2019.
(Continued)

*Primary Examiner* — Richard Isla
*Assistant Examiner* — Johali A Torres Ruiz
(74) *Attorney, Agent, or Firm* — Kenealy Vaidya LLP

(57) ABSTRACT

A differential voltage measurement device includes a first capacitor, a second capacitor of which the capacity is smaller than that of the first capacitor, a differential amplification unit which outputs a voltage according to a differential voltage between a voltage held in the first capacitor and a voltage held in the second capacitor, and a control unit which guides a first voltage to the first capacitor and guides a second voltage to the second capacitor in a state where the first capacitor holds the first voltage.

8 Claims, 12 Drawing Sheets

(51) Int. Cl.
    *B60L 58/10*     (2019.01)
    *B60L 50/50*     (2019.01)
    *G01R 31/3835*     (2019.01)
    *G01R 19/00*     (2006.01)
    *G01R 19/10*     (2006.01)
    *G01R 31/374*     (2019.01)
    *G01R 31/396*     (2019.01)
    *H02J 7/34*     (2006.01)

(52) U.S. Cl.
    CPC .......... *Y02T 10/7005* (2013.01); *Y02T 10/705* (2013.01); *Y02T 10/7055* (2013.01)

(56) References Cited

U.S. PATENT DOCUMENTS

| | | | |
|---|---|---|---|
| 8,810,311 B2 | 8/2014 | Ivanov et al. | |
| 2005/0105369 A1* | 5/2005 | Schoenfeld | G11C 5/14 365/227 |
| 2009/0102752 A1* | 4/2009 | Honda | G09G 3/32 345/55 |
| 2010/0327958 A1* | 12/2010 | Guo | H03K 17/0822 327/534 |
| 2011/0279148 A1* | 11/2011 | Watanabe | G11C 27/026 327/96 |
| 2015/0188329 A1* | 7/2015 | Bradley | G01R 31/389 320/107 |
| 2016/0056643 A1 | 2/2016 | Syouda | |

FOREIGN PATENT DOCUMENTS

| | | |
|---|---|---|
| JP | 3-42577 A | 2/1991 |
| JP | 4-305166 A | 10/1992 |
| JP | 2009-53012 A | 3/2009 |
| JP | 2013-118451 A | 6/2013 |
| JP | 2014-117068 A | 6/2014 |
| JP | 2014-219311 A | 11/2014 |
| JP | 2015-83960 A | 4/2015 |
| WO | WO-2014181812 A1 * | 11/2014 |

OTHER PUBLICATIONS

Japanese Office Action for the related Japanese Patent Application No. 2016-223051 dated Jan. 8, 2019.

Japanese Office Action for the related Japanese Patent Application No. 2016-223051 dated Apr. 16, 2019.

* cited by examiner

DIFFERENTIAL VOLTAGE MEASUREMENT DEVICE

BACKGROUND

Technical Field

The present invention relates to a technology of increasing the accuracy in measurement of a differential voltage between a first voltage and a second voltage which are sequentially acquired.

Related Art

For example, various types of vehicles such as an electric vehicle (EV) running using an electric motor and a hybrid vehicle (HEV) running using both an engine and the electric motor are mounted with a secondary battery such as a lithium ion battery and a nickel hydrogen battery as a power source of the electric motor.

It has been known that such a secondary battery is gradually degraded and a chargeable capacity (a current capacity or a power capacity) is gradually reduced as it is charged and discharged repeatedly. Then, the electric vehicle using the secondary battery detects a degree of degradation of the secondary battery to obtain the chargeable capacity to calculate a movable distance using the secondary battery and a life span of the secondary battery.

As one of indexes indicating the degree of degradation of the secondary battery, there is a state of health (SOH) which is a ratio of the current chargeable capacity to an initial changeable capacity. It has been known that the SOH is related to an internal resistance of the secondary battery. Therefore, since the internal resistance of the secondary battery is detected, the SOH can be obtained on the basis of the internal resistance.

In general, since the internal resistance is significantly small, it is difficult to obtain a sufficient detection accuracy. JP 2014-219311 A discloses a battery state detection device for increasing the detection accuracy of the internal resistance.

FIG. 12 is a diagram schematically illustrating a configuration of a battery state detection device 500 disclosed in JP 2014-219311 A. A secondary battery (detection target) B has an electromotive force part e which generates a voltage and an internal resistance r. The SOH of the secondary battery B can be obtained by detecting the internal resistance r.

The secondary battery B generates a voltage V between both electrodes (a positive electrode Bp and a negative electrode Bn). The voltage V is measured by a voltage Ve generated by an electromotive force of the electromotive force part e and a voltage Vr generated by a current flowing to the internal resistance r (V=Ve+Vr). The negative electrode Bn of the secondary battery B is connected to a reference potential G.

The battery state detection device 500 includes a differential amplification unit 511, a changeover switch 512, a first capacitor 513, a second capacitor 514, a charging unit 515, a first analog/digital converter (ADC) 521, a second analog/digital converter (ADC) 522, and a microcomputer (μCOM) 540.

In the configuration illustrated in this drawing, when the μCOM 540 transmits a control signal through an output port PO2 to the charging unit 515 to start the charging, the charging unit 515 starts to make a predetermined charging current Ic flow to the secondary battery B. With this configuration, the charging of the secondary battery B starts.

When the charging starts, the μCOM 540 controls the changeover switch 512 through an output port PO1, and connects the positive electrode Bp of the secondary battery B and the first capacitor 513. Therefore, a voltage (V1=Ve+r·Ic) between both electrodes of the charging secondary battery is held in the first capacitor 513.

Next, when the voltage between both electrodes of the secondary battery B acquired through an input port PI1 becomes a predetermined state detection voltage, the μCOM 540 controls the changeover switch 512 through the output port PO1, and connects the positive electrode Bp of the secondary battery B and the second capacitor 514, and transmits a control signal to stop the charging to the charging unit 515 through the output port PO2.

Therefore, when the charging current Ic toward the secondary battery B stops, and the accumulation state of the second capacitor 514 is stabilized, the voltage between both electrodes of the secondary battery B during not charging is held in the second capacitor 514 (V2=Ve).

In this state, the μCOM 540 detects an amplification voltage Vm which is output by the differential amplification unit 511 through an input port PI2. Then, the detected amplification voltage Vm is divided by an amplification factor Av of the differential amplification unit 511, and further divided by the charging current Ic to detect the internal resistance r of the secondary battery B (=(Vm/Av)/Ic).

Finally, the μCOM 540 transmits the control signal to the charging unit 515 through the output port PO2 to start the charging. The charging unit 515 starts to make the predetermined charging current Ic flow again to the secondary battery B according to the control signal. Therefore, the charging restarts, and the battery state detection process ends.

Patent Literature 1: JP 2014-219311 A

SUMMARY

According to the battery state detection device 500 disclosed in JP 2014-219311 A, the detection accuracy of the internal resistance of the secondary battery can be increased, and the reduction of the detection accuracy in the battery state can be suppressed.

In addition, by applying the technology of the battery state detection device 500, it is possible to configure a differential voltage measurement device which can accurately measure a minute voltage change in a first state and a second state of a voltage source such as a battery and a potential difference between two points in the circuit as well as the internal resistance of the secondary battery.

In other words, the following processes are sequentially performed to a minute voltage change in the first state and the second state of the voltage source or the potential difference between one point and another point in the circuit can be measured with accuracy.

1) the voltage of the voltage source in the first state or the voltage of one point in the circuit is sampled and held as the first voltage by the switch 512 and the first capacitor 513.

2) the voltage of the voltage source in the second state or the voltage of the other point in the circuit is sampled and held as the second voltage by the switch 512 and the second capacitor 514.

3) the difference between the first voltage and the second voltage is amplified by the differential amplification unit 511, the amplification voltage Vm output by the differential amplification unit 511 is divided by the amplification factor Av of the differential amplification unit 511.

In the example disclosed in JP 2014-219311 A, a state that a constant current Ic flows to the secondary battery B corresponds to the first state, and a state that the current does not flow corresponds to the second state. Further, the voltage source which is a detection target for the voltage change is not limited to the secondary battery, and may be a primary battery, a cell of a battery pack, or a power source circuit.

However, a minute leakage current is generated in an actual capacitor, and thus the accumulated charges are leaking out. Therefore, the charges accumulated in the first capacitor 513 are more slightly leaking out compared to the leakage current in a time until the second capacitor 514 ends the sample and hold operation on the voltage of the battery in the second state after the first capacitor 513 ends the sample and hold operation on the voltage of the battery in the first state.

When the charges leak out of the first capacitor 513, the first voltage is detected slightly lower than an actual value, and the accuracy in measurement is reduced. An object of the invention is to increase the accuracy in measurement of a voltage difference between the first voltage and the second voltage which are sequentially acquired.

According to the invention in order to solve the above problems, there is provided a differential voltage measurement device which includes: a first capacitor, a second capacitor of which the capacity is smaller than that of the first capacitor, a differential amplification unit that outputs a voltage according to a differential voltage between a voltage held in the first capacitor and a voltage held in the second capacitor, and a control unit that guides a first voltage to the first capacitor, and guide a second voltage to the second capacitor in a state where the first capacitor holds the first voltage.

Herein, the differential voltage measurement device further includes a changeover switch that exclusively switches a connection destination of an input terminal to which a voltage is input to the first capacitor and the second capacitor. The control unit may control the changeover switch to guide the first voltage to the first capacitor and to guide the second voltage to the second capacitor in a state where the first capacitor holds the first voltage.

The differential voltage measurement device further includes a leakage current prevention switch that switches a connection state such that a connection side of the changeover switch to the first capacitor is changed to the opposite side. The control unit may switch the leakage current prevention switch to a disconnected state during a period when the second voltage is guided to the second capacitor in a state where the first capacitor holds the first voltage.

In addition, the differential voltage measurement device includes a protection switch that switches a connection state of the differential amplification unit with respect to the first capacitor and the second capacitor, and a temperature sensor. The control unit may guide the first voltage to the first capacitor, and set the protection switch to be a disconnected state during a period when the second voltage is guided to the second capacitor in a state where the first capacitor holds the first voltage. The protection switch may be set to be a connected state after the second voltage is guided to the second capacitor and a waiting time set according to a measured value of the temperature sensor elapses.

In addition, the control unit may control a switch which exclusively switches a connection destination of an input terminal to which a voltage is input to the first capacitor and the second capacitor so as to guide the first voltage to the first capacitor and to guide the second voltage to the second capacitor in a state where the first capacitor holds the first voltage.

In addition, the differential voltage measurement device may further include a current output unit that switches and outputs a first current to be supplied for generating the first voltage and a second current to be supplied for generating the second voltage.

In addition, the control unit is configured to acquire a value of a current for generating the first voltage and the second voltage, and nullify an output result of the differential amplification unit in any one of the following cases:

1) a current value acquired during a period when the first voltage is guided to the first capacitor has been changed, 2) a current value acquired until the second voltage is guided to the second capacitor after the first voltage is guided to the first capacitor has not been changed, and 3) a current value acquired during a period when the second voltage is guided to the second capacitor has been changed.

In addition, the control unit may correct an output result of the differential amplification unit on the basis of a predetermined resistance value which relates to an internal connection of a supply source of the first voltage and the second voltage.

According to the invention, the capacity of the first capacitor is set to be large and the capacity of the second capacitor is set to be small, so that the voltage drop caused by the leakage of charges of the first capacitor can be reduced and a time taken for accumulating the charges of the second capacitor can be shortened. Therefore, it is possible to reduce the voltage drop of the first capacitor during a period when the second capacitor accumulates the charges. The accuracy in measurement of a differential voltage between the first voltage and the second voltage sequentially acquired can be increased.

DETAILED DESCRIPTION

Figure 1:
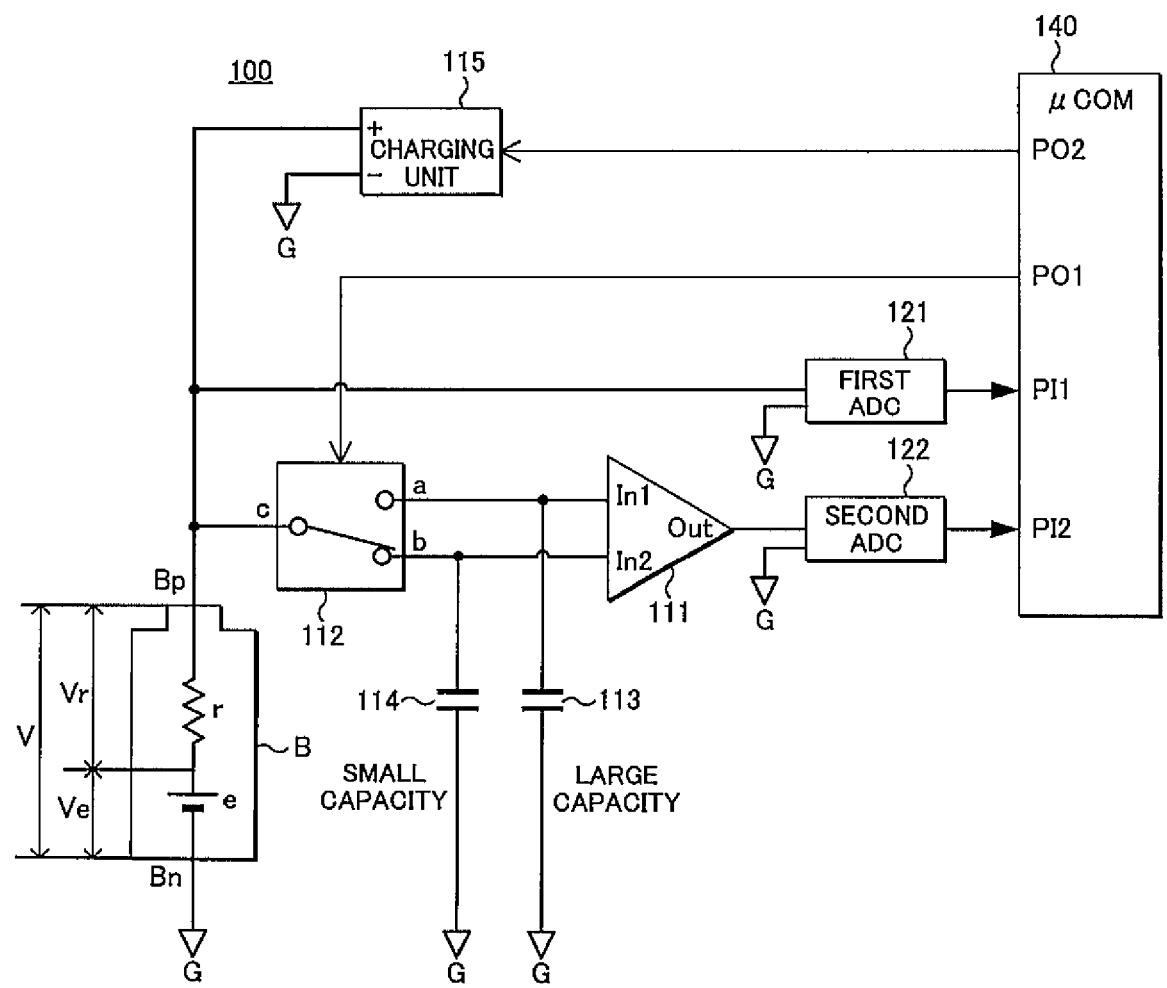
FIG. 1 is a diagram schematically illustrating a configuration of a battery state detection device of a first embodiment.

Embodiments of the invention will be described with reference to the drawings. A first embodiment is an example in which a differential voltage measurement device of the invention is applied to a battery state detection device. FIG. 1 is a diagram schematically illustrating a configuration of the battery state detection device of the first embodiment of the invention.

A battery state detection device 100 of this embodiment is, for example, mounted in an electric vehicle, connected between electrodes of a secondary battery equipped in the electric vehicle to detect an internal resistance of the secondary battery as a state of the secondary battery. Of course, the differential voltage measurement device may be applied to any device and system equipped with the secondary battery other than the electric vehicle.

A secondary battery (detection target) B has an electromotive force part e which generates a voltage and an internal resistance r. The SOH of the secondary battery B can be obtained by detecting the internal resistance r.

The secondary battery B generates a voltage V between both electrodes (a positive electrode Bp and a negative electrode Bn). The voltage V is measured by a voltage Ve generated by an electromotive force of the electromotive force part e and a voltage Vr generated by a current flowing to the internal resistance r (V=Ve+Vr). The negative electrode Bn of the secondary battery B is connected to a reference potential G.

As illustrated in this drawing, the battery state detection device 100 includes a differential amplification unit 111, a changeover switch 112, a first capacitor 113, a second capacitor 114, a charging unit 115, a first analog/digital converter (ADC) 121, a second analog/digital converter (ADC) 122, and a microcomputer (μCOM) 140.

The differential amplification unit 111 is configured by an operational amplifier for example, includes two input terminals (a first input terminal In1 and a second input terminal In2) and one output terminal (an output terminal Out), obtains an amplification voltage Vm by amplifying a differential voltage input through these two input terminals by a predetermined amplification factor Av, and outputs the amplification voltage Vm through the output terminal.

The changeover switch 112 is, for example, a one circuit-two contact (single pole and double throw (SPDT)) switch which is configured by an analog switch. The changeover switch 112 has two switching terminals a and b, in which the switching terminal a is connected to the first input terminal In1 of the differential amplification unit 111, and the switching terminal b is connected to the second input terminal In2 of the differential amplification unit 111. In addition, a common terminal c of the changeover switch 112 is connected to the positive electrode Bp of the secondary battery B.

The changeover switch 112 is connected to an output port PO1 of the μCOM 140, and switches the connection between the common terminal c and two switching terminals a and b according to a control signal from the μCOM 140, so that the positive electrode Bp of the secondary battery B is exclusively connected to the first input terminal In1 and the second input terminal In2.

The first capacitor 113 is connected between the first input terminal In1 of the differential amplification unit 111 and the reference potential G. In other words, the first capacitor 113 is provided between the first input terminal In1 and the negative electrode Bn of the secondary battery B. Therefore, a voltage between the first input terminal In1 and the negative electrode Bn of the secondary battery B is held in the first capacitor 113.

The second capacitor 114 is connected between the second input terminal In2 of the differential amplification unit 111 and the reference potential G. In other words, the second capacitor 114 is provided between the second input terminal In2 and the negative electrode Bn of the secondary battery B. Therefore, a voltage between the second input terminal In2 and the negative electrode Bn of the secondary battery B is held in the second capacitor 114.

Herein, the battery state detection device 100 of this embodiment is designed such that the capacity of the first capacitor 113 accumulating the charges at first becomes larger than that of the second capacitor 114 on the basis of a difference between the capacities of the first and second capacitors 113 and 114. In general, the capacitor can be less affected by a voltage drop caused from the leakage current as the capacity becomes large, and a sample and hold operation can be made more shortly as the capacity becomes small.

The charging unit 115 is connected between the positive electrode Bp of the secondary battery B and the reference potential G, and is provided to make a predetermined charging current Ic flow to the secondary battery B during charging the secondary battery B. Therefore, the charging unit can serve as a current output unit. The charging unit 115 is connected to an output port PO2 of the μCOM 140 described below, charges the secondary battery B with the charging current Ic, and stops the flowing of the charging current Ic to the secondary battery B to stop the charging according to the control signal from the μCOM 140.

The first analog/digital converter (ADC) 121 quantizes the voltage between both electrodes of the secondary battery B to output a signal indicating a digital value corresponding to the voltage. The second analog/digital converter (ADC) 122 quantizes the amplification voltage Vm output from the differential amplification unit 111, and outputs a signal indicating a digital value corresponding to the amplification voltage Vm.

The μCOM 140 is configured by a CPU, a ROM, and a RAM which are embedded therein, and serves as a control unit to make the entire control of the battery state detection device 100. The μCOM 140 includes the first output port PO1 which is connected to the changeover switch 112 and the second output port PO2 which is connected to the charging unit 115, and transmits the control signal to the changeover switch 112 through the first output port PO1 to control the changeover switch 112 such that the positive electrode Bp of the secondary battery B is connected to the first input terminal In1 while charging the secondary battery B and the positive electrode Bp of the secondary battery B is connected to the second input terminal In2 while not charging the secondary battery B.

In addition, the charging unit 115 is controlled to stop the charging of the secondary battery B when the control signal is transmitted to the charging unit 115 through the second output port PO2 and the voltage V between both electrodes of the secondary battery B reaches a predetermined state detection voltage Vth while the charging unit 115 is charging the secondary battery B.

The μCOM 140 includes the first input port PI1 to which a signal output from the first ADC 121 is input, and the second input port PI2 to which a signal output from the second ADC 122 is input. On the basis of these signals, the μCOM 140 detects the voltage V between both electrodes of the secondary battery B and the amplification voltage Vm output by the differential amplification unit 111. Then, the internal resistance r of the secondary battery B is detected on the basis of the amplification voltage Vm and the charging current Ic.

Figure 2:
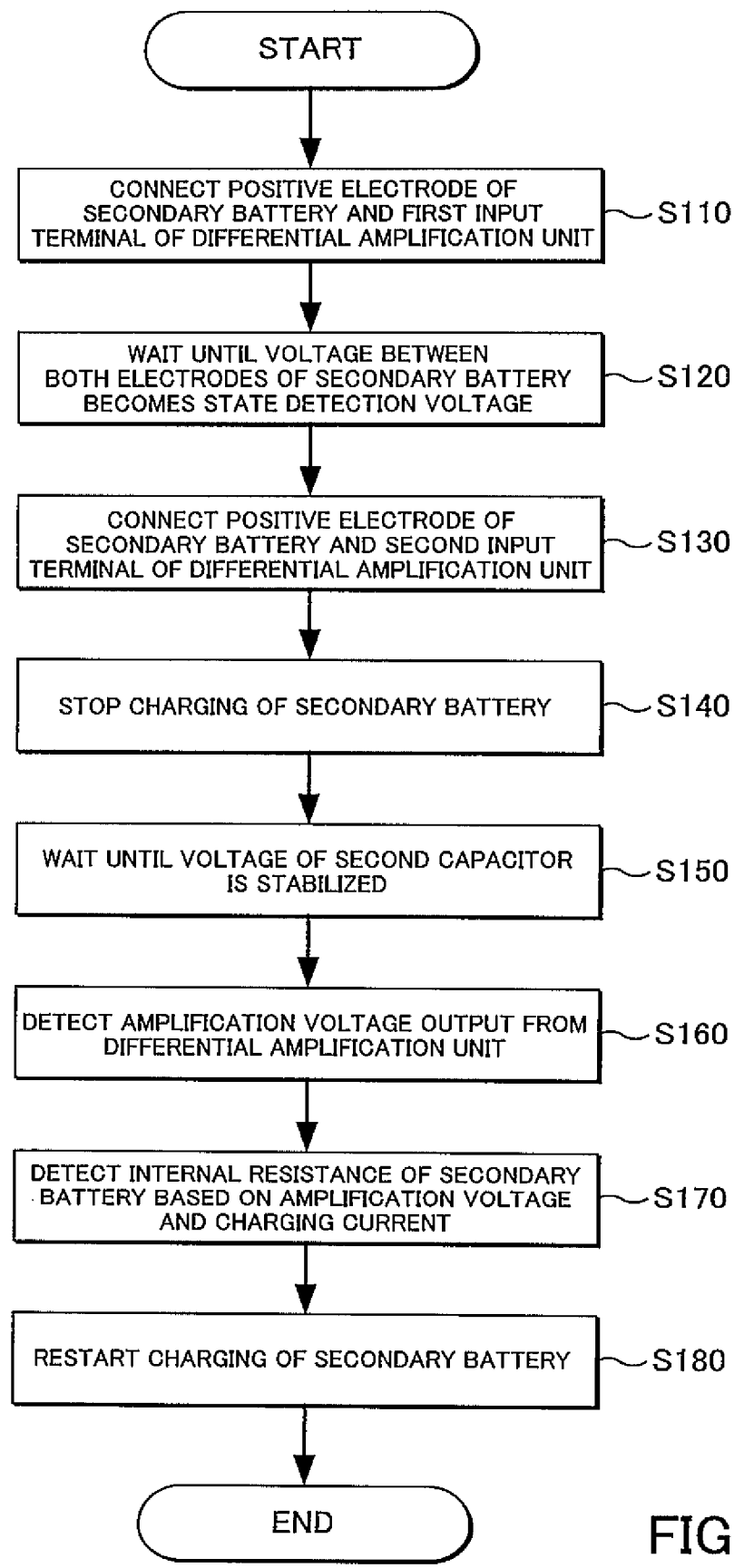
FIG. 2 is a flowchart illustrating an example of a battery state detection process in the battery state detection device.

Next, the description will be given about an exemplary battery state detection process in the μCOM 140 equipped in the battery state detection device 100 of the first embodiment with reference to a flowchart of FIG. 2.

The μCOM 140 transmits a control signal to the charging unit 115 through the second output port PO2 to start the charging when receiving a charging start command of the secondary battery B through a communication port from an electronic control device equipped in the vehicle for example. The charging unit 115 starts to make a predetermined charging current Ic flow to the secondary battery B according to the control signal. Therefore, the charging of the secondary battery B starts.

The μCOM 140 transmits the control signal to the changeover switch 112 through the first output port PO1 to connect the switching terminal a and the common terminal c when the charging current Ic is flowing to the secondary battery B (S110).

The changeover switch 112 connects the positive electrode Bp of the secondary battery B and the first input terminal In1 of the differential amplification unit 111 when the switching terminal a and the common terminal c are connected according to the control signal.

Therefore, the first capacitor 113 is connected between the positive electrode Bp and the negative electrode Bn of the secondary battery B, and the charges flow into the first capacitor 113 from the secondary battery B and the charging unit 115. Then, when a certain amount of time elapses, the charges are accumulated in the first capacitor 113 up to an upper limit, and the voltage between both electrodes of the charging secondary battery B is held as a first voltage in the first capacitor 113.

Next, the μCOM 140 is on standby until the voltage between both electrodes of the secondary battery B reaches the state detection voltage Vth (S120). Then, when the voltage between both electrodes of the secondary battery B becomes the predetermined state detection voltage Vth, a control signal is transmitted to the changeover switch 112 through the first output port PO1 to connect the switching terminal b and the common terminal c (S130), and at almost the same time a control signal is transmitted to the charging unit 115 through the second output port PO2 to stop the charging (S140).

The changeover switch 112 connects the positive electrode Bp of the secondary battery B and the second input terminal In2 of the differential amplification unit 111 by connecting the switching terminal b and the common terminal c according to the control signal.

Therefore, the second capacitor 114 is connected between the positive electrode Bp and the negative electrode Bn of the secondary battery B, and the charges flow into the second capacitor 114 from the secondary battery B. In addition, the charging unit 115 stops the charging current Ic to the secondary battery B according to the control signal from the μCOM 140.

During a period when the second capacitor 114 and the secondary battery B are connected by the changeover switch 112, the first capacitor 113 is disconnected from the secondary battery B. However, the first capacitor 113 is designed to have a large capacity, so that a losing amount of charges caused by the leakage current can be made small.

Then, the process is on standby until a predetermined battery charging time which is taken by the second capacitor 114 to accumulate the charges up to the upper limit elapses (S150). The second capacitor 114 is designed to have a small capacity and thus can accumulate the charges up to the upper limit in a short time. Therefore, the losing amount of charges from the first capacitor 113 can be made small still more.

When the battery charging time elapses, the second capacitor 114 accumulates the charges up to the upper limit to stabilize the holding voltage. The voltage between both electrodes of the charging secondary battery B is held as a second voltage in the second capacitor 114.

Next, the μCOM 140 detects the amplification voltage Vm output from the differential amplification unit 111 on the basis of information obtained from the signal input in the second input port PI2 when the voltage held in the second capacitor is stabilized (that is, at the time when the battery charging time elapses) (S160).

The μCOM 140 detects the internal resistance r of the secondary battery B by dividing the detected amplification voltage Vm by the amplification factor Av of the differential amplification unit 111 and by dividing the resultant voltage by the charging current Ic (r=(Vm/Av)/Ic) (S170).

Finally, the μCOM 140 transmits the control signal to the charging unit 115 through the second output port PO2 to start the charging (S180). The charging unit 115 starts to make the predetermined charging current Ic flow again to the secondary battery B according to the control signal. Therefore, the charging restarts, and the battery state detection process ends.

As described above, in the battery state detection device 100 of this embodiment, the capacity of the first capacitor 113 which first accumulates the charges is set to be larger than that of the second capacitor 114.

Since the capacity of the first capacitor 113 is set to be large, it is possible to reduce the voltage drop caused by the charge leakage during a period when the second capacitor 114 accumulates the charges. Since the capacitor of the second capacitor 114 is set to be small, it is possible to shorten the battery charging time of the second capacitor 114. Therefore, a differential voltage can be detected in a state where the first voltage of the first capacitor 113 is not lowered, and thus the accuracy in measurement can be improved.

Figure 3:
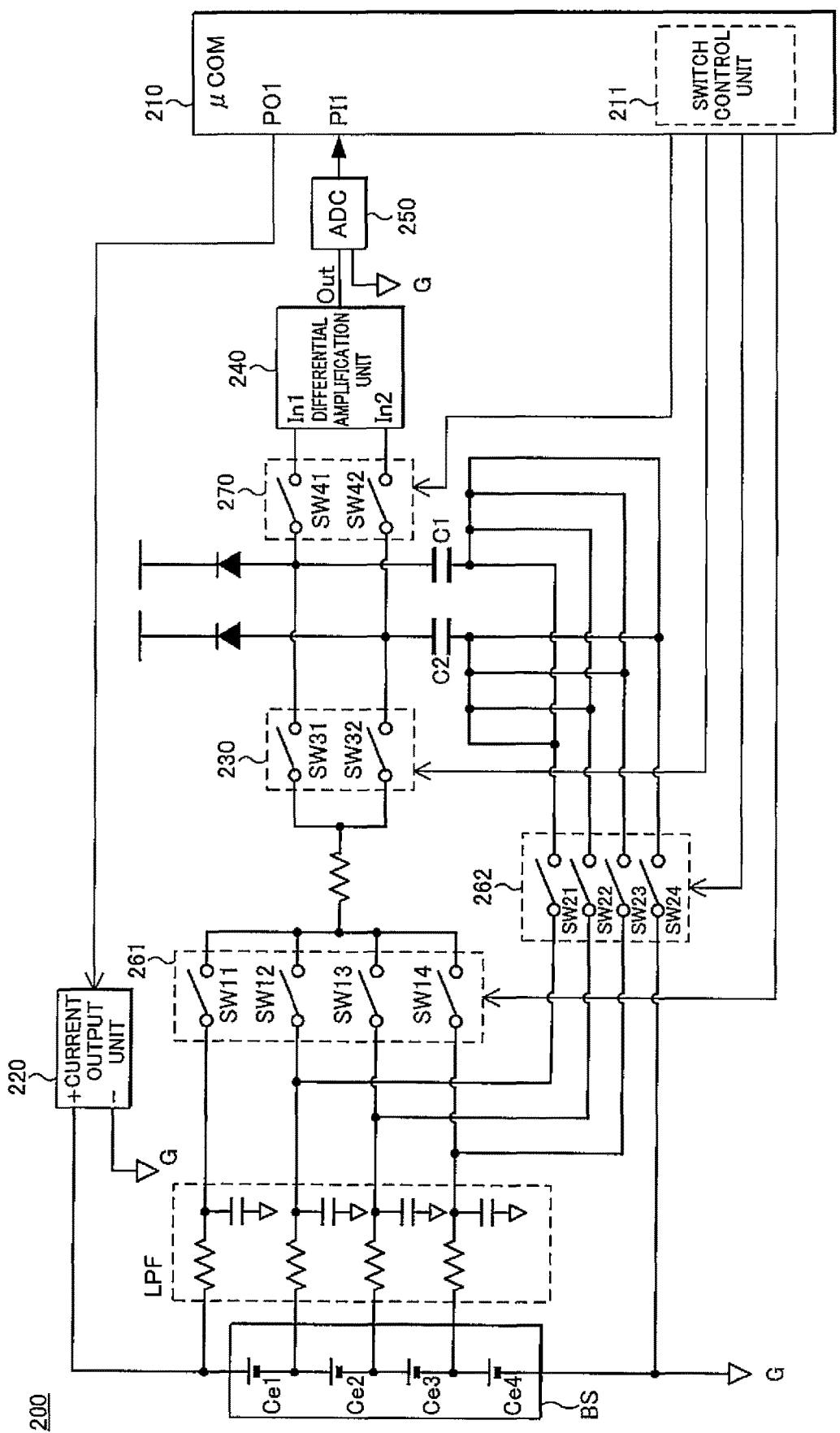
FIG. 3 is a diagram schematically illustrating a configuration of a differential voltage measurement device of a second embodiment.

Next, a second embodiment of the invention will be described. FIG. 3 is a diagram illustrating the outline of the differential voltage measurement device of the second embodiment of the invention. A differential voltage measurement device 200 of the second embodiment is obtained by using the technology of the battery state detection device 100, and a battery pack BS equipped with a plurality of assembled battery cells (Ce1 to Ce4) is used as a voltage source (measurement target).

As illustrated in this drawing, the differential voltage measurement device 200 includes a first capacitor C1, a second capacitor C2, a μCOM 210, a current output unit 220, a changeover switch 230, a differential amplification unit 240, an ADC 250, a detection target select switch 261, a reference potential setting switch 262, and a protection switch 270.

The current output unit 220 makes a constant current flow to the battery pack BS on the basis of a command of the μCOM 210. A first state and a second state of the battery pack BS are made by switching the constant current flowing to the battery pack BS. Any one of the first state and the second state may be a state where the current does not flow.

The first capacitor C1 holds a voltage at the measurement target in the battery pack BS in the first state as the first voltage. The second capacitor C2 holds a voltage at the measurement target in the battery pack BS in the second state as the second voltage. Herein, the capacity of the first capacitor C1 is designed to be larger than that of the second capacitor C2.

The changeover switch 230 includes a SW31 which guides the voltage (the first voltage) at the measurement target in the battery pack BS in the first state toward the first capacitor C1, and a SW32 which guides the voltage (the second voltage) at the measurement target in the battery pack BS in the second state to the second capacitor C2.

The detection target select switch 261 is provided between the end portions of the respective battery cells (Ce1 to Ce4) forming the battery pack BS and the changeover switch 230. Specifically, a SW11 is provided between the end portion of the battery cell Ce1 corresponding to the positive electrode of the battery pack BS and the changeover switch 230, a SW12 is provided between the junction of the battery cell Ce1 and the battery cell Ce2 and the changeover switch 230, a SW13 is provided between the junction of the battery cell Ce2 and the battery cell Ce3 and the changeover switch 230, and a SW14 is provided between the junction of the battery cell Ce3 and the battery cell Ce4 and the changeover switch 230.

The reference potential setting switch 262 is a switch which is used to set the reference potential of the first capacitor C1 and the second capacitor C2. Specifically, a SW24 is provided to set the reference potential of the reference potential of the first capacitor C1 and the second capacitor C2 with the reference potential G, a SW23 is provided to set the reference potential of the first capacitor C1 and the second capacitor C2 with the voltage of the battery cell Ce4, a SW22 is provided to set the reference potential of the first capacitor C1 and the second capacitor C2 with the voltage of the battery cell Ce4+ the battery cell Ce3, and a SW21 is provided to set the reference potential of the first capacitor C1 and the second capacitor C2 with the voltage of the battery cell Ce4+ he battery cell Ce3+ the battery cell Ce2.

The protection switch 270 is a switch to protect the differential amplification unit 240. The protection switch 270 is a switch to guide the first voltage and the second voltage to the differential amplification unit 240 after the sample and hold operation is completed in the first capacitor C1 and the second capacitor C2, and includes a SW41 which is provided between the first capacitor C1 and the first input terminal In1 and a SW42 which is provided between the second capacitor C2 and the second input terminal In2. Both the SW41 and the SW42 are turned off during the sample and hold operation, and turned on after the sample and hold operation ends to guide the first voltage and the second voltage to the differential amplification unit 240.

Figure 4:
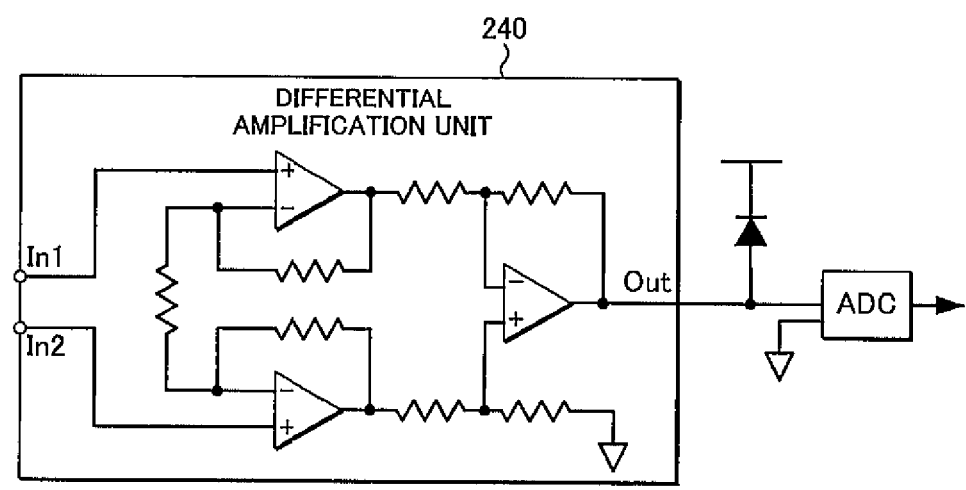
FIG. 4 is a circuit diagram illustrating an example of a differential amplification unit.

The differential amplification unit 240 includes two input terminals (the first input terminal In1 and the second input terminal In2) and one output terminal (the output terminal Out), and outputs the amplification voltage Vm obtained by amplifying a differential voltage input to two input terminals with the predetermined amplification factor Av from the output terminal. The differential amplification unit 240 may be configured by an operational amplifier or a circuit illustrated in FIG. 4 for example.

The ADC 250 quantizes the amplification voltage Vm output from the differential amplification unit 240, and outputs a signal indicating a digital value corresponding to the amplification voltage Vm.

The μCOM 210 is configured by a CPU, a ROM, and a RAM which are embedded therein, and serves as a control unit to make the entire control of the differential voltage measurement device 200. The μCOM 210 includes the first output port PO1 which is connected to the current output unit 220, the first input port PI1 to which the signal output from the ADC 250 is input, and a switch control unit 211 which controls the respective switches.

The differential voltage measurement device 200 can obtain the SOH of each battery cell by measuring the internal resistance of each battery cell for example. In a case where the internal resistance of the battery cell Ce1 is measured, only the SW11 of the detection target select switch 261 is turned on, and only the SW21 of the reference potential setting switch 262 is turned on. Therefore, the voltage between both terminals of the Ce1 comes to be guided to the first capacitor C1 and the second capacitor C2.

Then, a predetermined first constant current I1 flows from the current output unit 220 as the first state, and the SW31 of the changeover switch 230 is turned on. Therefore, the voltage of the battery cell Ce1 in the first state is held as the first voltage in the first capacitor C1.

Next, a predetermined second constant current I2 flows from the current output unit 220 as the second state, and the SW32 of the changeover switch 230 is turned on. Therefore, the voltage of the battery cell Ce1 in the second state is held in the second capacitor C2.

When the protection switch 270 is turned on and the first voltage and the second voltage are guided to the differential amplification unit 240, a differential voltage is input to the μCOM 210. The μCOM 210 can obtain an internal resistance $r1$ ($=(Vm/Av)/(I1-I2)$) of the battery cell Ce1 by the same principle as that of the first embodiment. The internal resistances of the other battery cells can be obtained in the same manner.

Even in the second embodiment, since the capacity of the first capacitor C1 is set to be large and the capacity of the second capacitor C2 is set to be small, the voltage drop of the first capacitor C1 can be made small during a period when the second capacitor C2 accumulates the charges, and the accuracy in measurement of the differential voltage between the first voltage and the second voltage can be increased.

Further, in the second embodiment, the switch control unit 211 operates the detection target select switch 261 and the reference potential setting switch 262 to measure various potential differences.

For example, the first voltage is acquired only by turning on the SW11 of the detection target select switch 261 in a state where only the SW21 of the reference potential setting switch 262 is turned on without causing the current to flow from the current output unit 220. Thereafter, the second voltage is acquired only by turning on the SW12 of the detection target select switch 261 to measure a differential voltage between the first voltage and the second voltage. Then, the resultant voltage becomes a potential difference between both terminals of the battery cell Ce1 (that is, a voltage of the battery cell Ce1). The voltages of the other battery cells can be also acquired in the same manner.

Even in this case, the capacity of the first capacitor C1 is set to be large, and the capacity of the second capacitor C2 is set to be small. Therefore, the voltage drop of the first capacitor C1 can be made small during a period when the second capacitor C2 accumulates the charges, and the accuracy in measurement of the differential voltage between the first voltage and the second voltage can be increased.

Hitherto, the description has been given about the first and second embodiments of the invention, but the differential voltage measurement device of the invention is not limited to the configurations of these embodiments.

For example, in the respective embodiments, the first constant current I1 and the second constant current I2 have been described as an example when the secondary battery B is charged by making the current flow from the charging unit 115 or the current output unit 220. However, the secondary battery V may be discharged by a load current generated by a load which is connected to the secondary battery B.

Furthermore, the configuration may be modified as described below. Further, the modification will be described using an example in a case where the second embodiment is applied, but the first embodiment may be applied.

Figure 5:
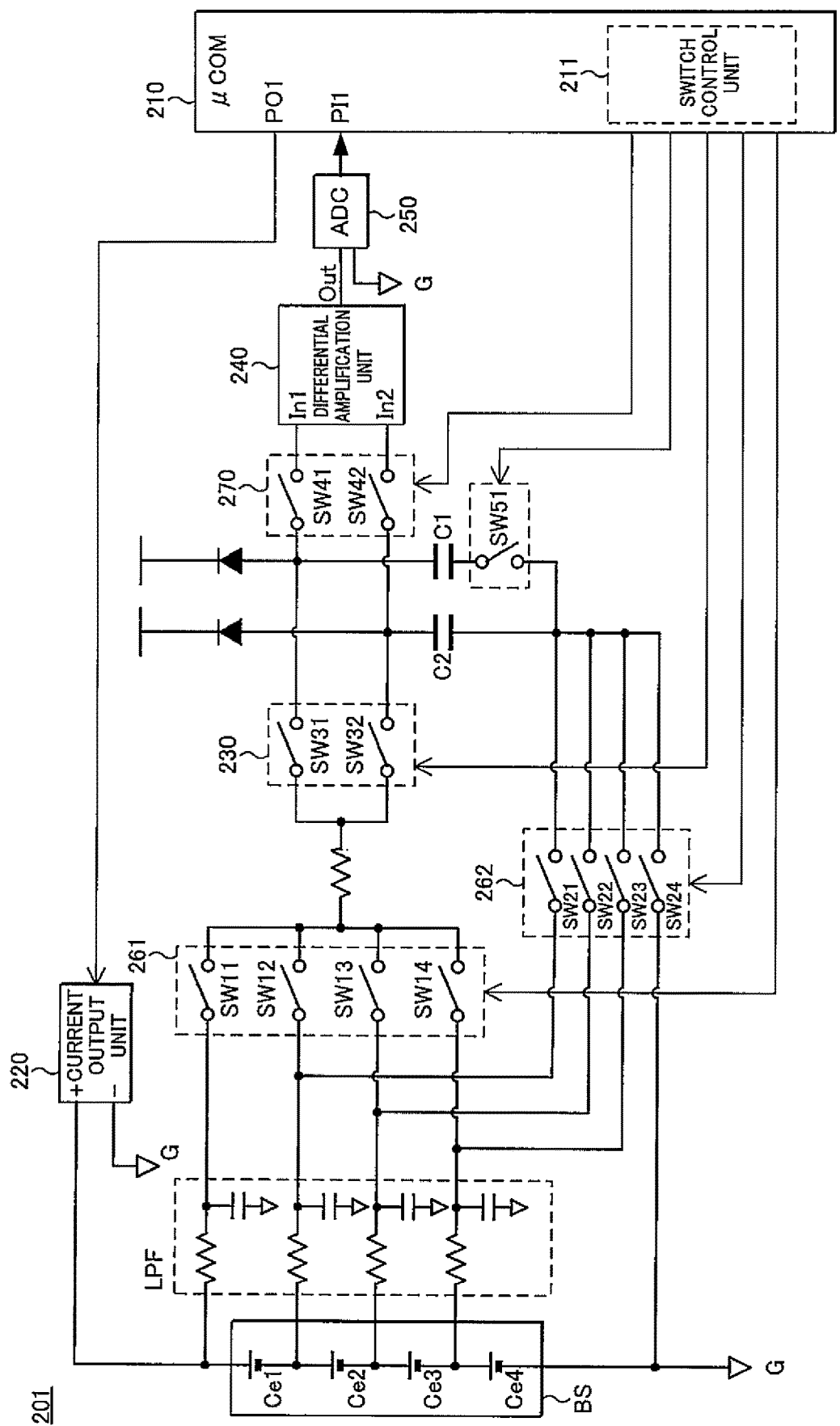
FIG. 5 is a block diagram illustrating a configuration of a first modification of the differential voltage measurement device.

FIG. 5 is a block diagram illustrating a configuration of a first modification of the differential voltage measurement device. As illustrated in this drawing, a differential voltage measurement device 201 includes the first capacitor C1, the second capacitor C2, the μCOM 210, the current output unit 220, the changeover switch 230, the differential amplification unit 240, the ADC 250, the detection target select switch 261, the reference potential setting switch 262, and the protection switch 270 similarly to the differential voltage measurement device 200 of the second embodiment. The description of these components will be omitted.

The differential voltage measurement device 201 of the first modification is further provided with a leakage current prevention switch SW51 on a side near the reference potential of the first capacitor C1. In other words, the current prevention switch SW51 is provided between the first capacitor C1 and the reference potential setting switch 262. The current prevention switch SW51 is controlled by the switch control unit 211 of the μCOM 210 to perform an ON/OFF switching control.

Figure 6:
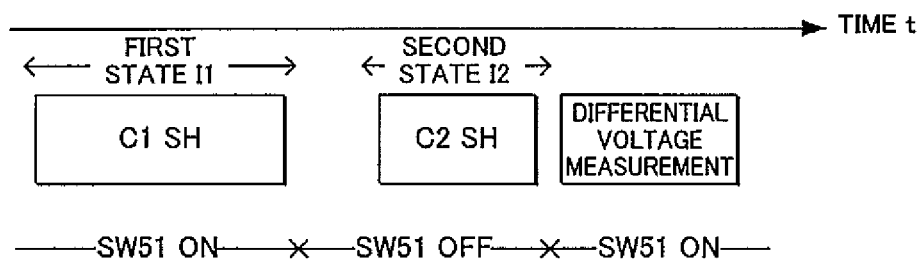
FIG. 6 is a diagram for describing an ON/OFF switching control of a leakage current prevention switch.

FIG. 6 is a diagram for describing the ON/OFF switching control of the leakage current prevention switch SW51. The description will be given about an example in a case where the voltage of the battery cell Ce1 is measured. Therefore, only the SW11 of the detection target select switch 261 is turned on, and only the SW21 of the reference potential setting switch 262 is turned on. The switching control of the changeover switch 230 and the protection switch 270 for performing the sample and hold operation and the differential voltage measurement are similar to those of FIG. 3, and thus the description thereof will be omitted.

First, the voltage of the battery cell Ce1 in the first state where the first constant current I1 flows is sampled and held by the first capacitor C1 in a state where the current prevention switch SW51 is turned on. When the sample and hold operation of the first capacitor C1 ends, the current prevention switch SW51 is switched to the OFF state. Therefore, the path between the first capacitor C1 and the reference potential is disconnected, and thus the leakage current of the first capacitor C1 can be reduced.

Then, the voltage of the battery cell Ce1 in the second state where the second constant current I2 flows is sampled and held by the second capacitor C2. Meanwhile, the current prevention switch SW51 is kept in the OFF state, and the leakage current is kept small. When the sample and hold operation of the second capacitor C2 ends, the current prevention switch SW51 is switched to the ON state, and the differential voltage is measured.

In this way, the differential voltage measurement device 201 of the first modification keeps the state of the current prevention switch SW51 OFF until the differential voltage is measured after the sample and hold operation of the first capacitor C1 ends in order to reduce the leakage current of the first capacitor C1. Therefore, it is possible to further prevent the reduction of the accuracy in measurement caused by the leakage of charges due to the leakage current.

Further, another leakage current prevention switch is provided even in the reference potential of the second capacitor C2, and kept in the OFF state until the differential voltage is measured after the sample and hold operation of the second capacitor C2 ends, so that it is possible to reduce the leakage current of the second capacitor C2 therebetween.

Figure 7:
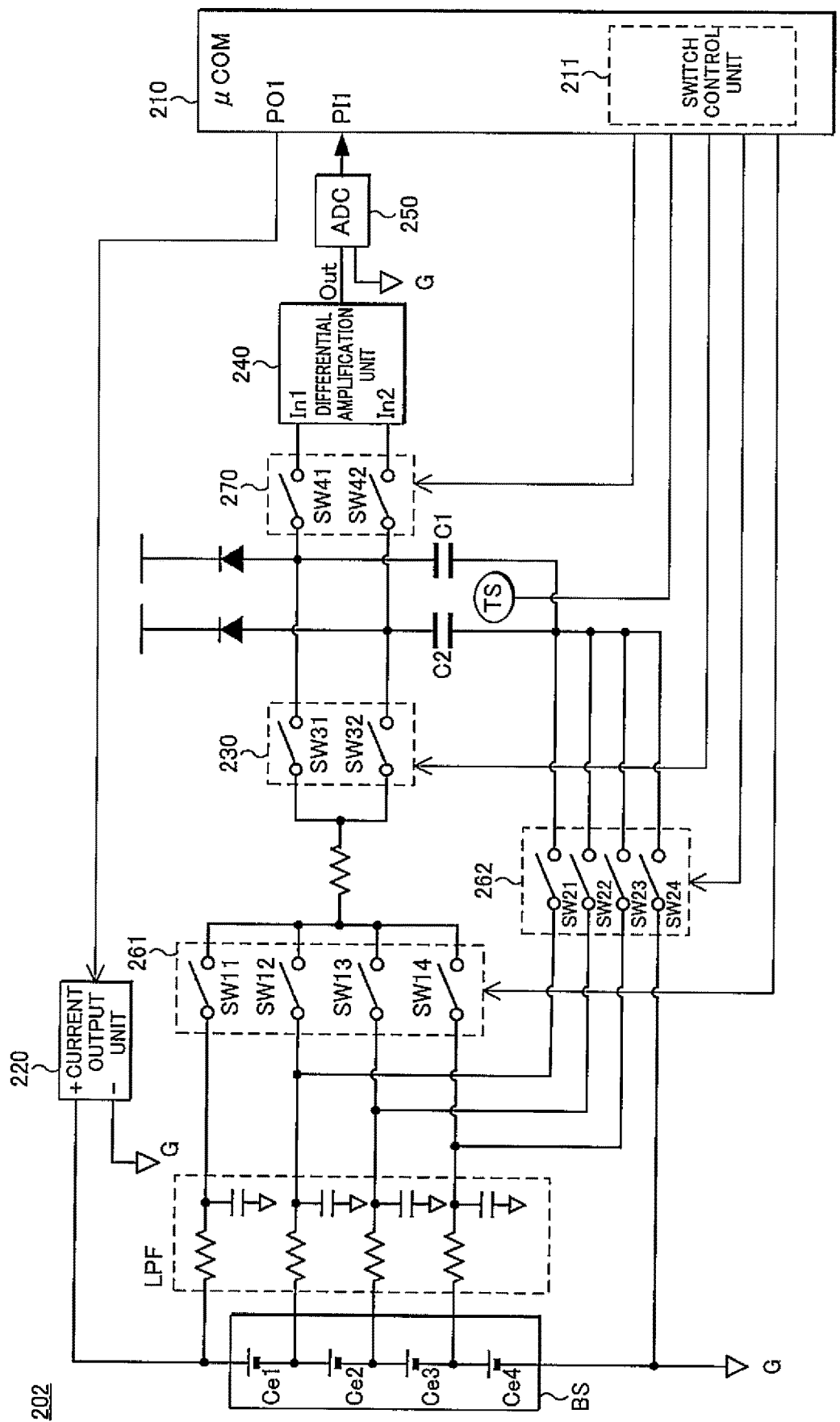
FIG. 7 is a block diagram illustrating a configuration of a second modification of the differential voltage measurement device.

FIG. 7 is a block diagram illustrating a configuration of a second modification of the differential voltage measurement device. As illustrated in this drawing, a differential voltage measurement device 202 includes the first capacitor C1, the second capacitor C2, the μCOM 210, the current output unit 220, the changeover switch 230, the differential amplification unit 240, the ADC 250, the detection target select switch 261, the reference potential setting switch 262, and the protection switch 270 similarly to the differential voltage measurement device 200 of the second embodiment. The description of these components will be omitted.

The differential voltage measurement device 202 of the second modification further includes a temperature sensor TS in the vicinity of the first capacitor C1 and the second capacitor C2. A measurement value of the temperature sensor TS is input to the μCOM 210. In this case, the temperature sensor TS may be provided in another place to estimate a temperature of the vicinity of the first capacitor C1 and the second capacitor C2.

Figure 8:
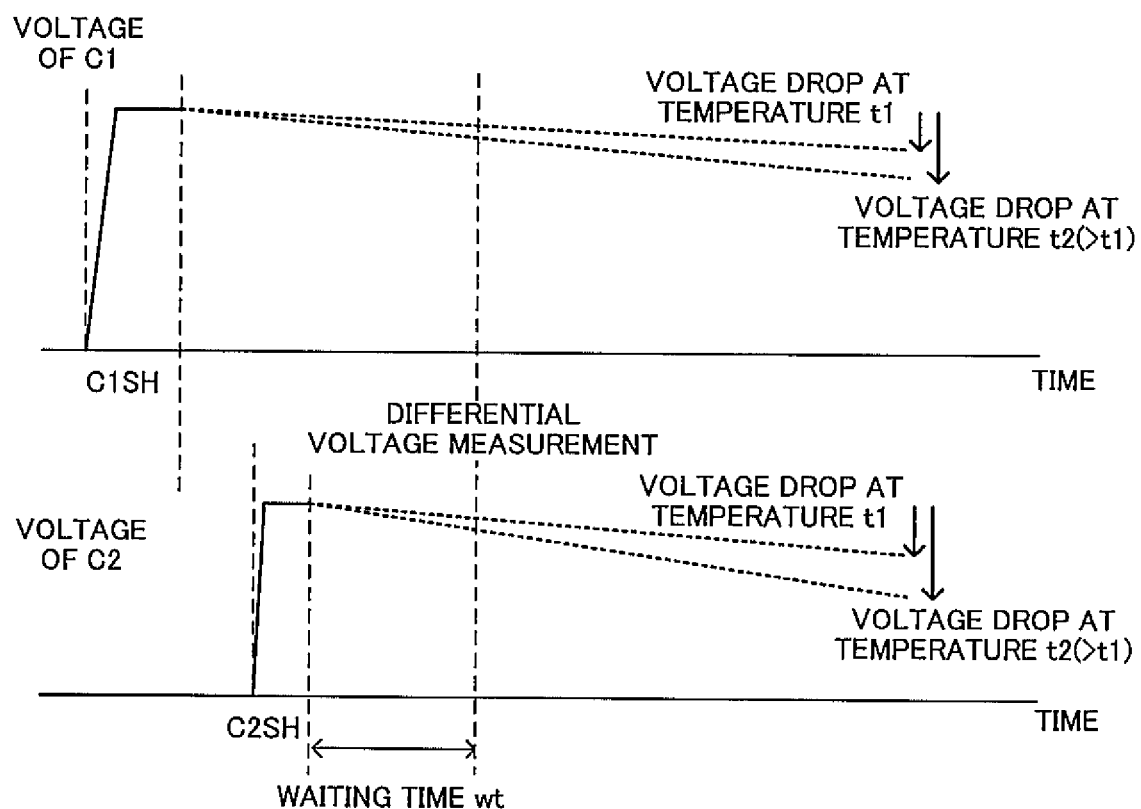
FIG. 8 is a diagram for describing a relation between a temperature and a leakage current of a capacitor.

In general, the leakage current of the capacitor is affected by the temperature, and the leakage current is increased as the temperature is increased. Therefore, when it is assumed that a temperature t2 is higher than a temperature t1, as illustrated in FIG. 8, the amount of the voltage drop of the first capacitor C1 at the temperature t1 after the sample and hold operation ends is larger than that at the temperature t2. The amount of the voltage drop of the second capacitor C2 also becomes larger at the temperature t1 than that at the temperature t2.

Herein, since the sample and hold operation of the second capacitor C2 is performed after the sample and hold operation of the first capacitor C1, the voltage drop caused by the leakage current is generated only by the first capacitor C1 at the time when the sample and hold operation of the second capacitor C2 ends.

On the other hand, since the capacity of the second capacitor C2 is smaller than that of the first capacitor C1, the voltage of the second capacitor C2 is lowered at a higher speed than that of the first capacitor C1 after the sample and hold operation of the second capacitor C2 ends.

Therefore, the amount of the voltage drop of first capacitor C1 is matched with that of the second capacitor C2 at a certain time after the sample and hold operation of the second capacitor C2 ends. If awaiting time wt is set to measure a differential voltage at this time, the amount of the voltage drop of both capacitors is cancelled. Therefore, it is possible to further prevent the reduction of the accuracy in measurement caused by the leakage of charges due to the leakage current. Herein, the waiting time wt is a time taken until the differential voltage is measured after the sample and hold operation of the second capacitor C2 ends.

However, even though the waiting time wt is the same, the amount of the voltage drop of the first capacitor C1 and the second capacitor C2 is affected by the temperature, and thus the amount of the voltage drop is increased as the temperature is increased as described above. Therefore, when the waiting time wt is fixedly set, the accuracy in measurement depends on a temperature change.

Therefore, the waiting time wt is changed according to a measurement value of the temperature sensor TS in the second modification. In other words, times when "the amount of the voltage drop of the first capacitor C1 until the sample and hold operation of the second capacitor C2 after the sample and hold operation of the first capacitor C1" is matched with "a difference between the amount of the voltage drop of the second capacitor C2 and the amount of the voltage drop of the first capacitor C1" after the sample and hold operation of the second capacitor C2 are experimentally obtained and stored in the μCOM 210 as the waiting times wt in a table format for the measured temperatures.

Then, at the time of actual measurement, the differential voltage may be measured after the waiting time wt corresponding to the measured temperature elapses after the sample and hold operation of the second capacitor C2. Therefore, it is possible to further prevent the reduction of the accuracy in measurement caused by the leakage of charges due to the leakage current.

Figure 9A:
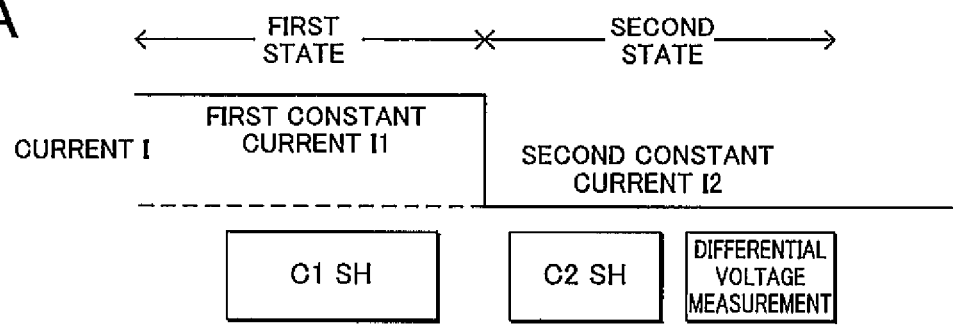
FIGS. 9A to 9C are diagrams for describing changes in current at the time of measurement.

Next, the description will be given about a third modification of the differential voltage measurement device. In the second embodiment, as illustrated in FIG. 9A, the current output unit 220 performs the sample and hold operation of the first capacitor C1 when the predetermined first constant current I1 is flowing, and then performs the sample and hold operation of the second capacitor C2 when the predetermined second constant current is flowing. In other words, the differential voltage measurement device is used to measure a current I which changes in an ideal stepwise waveform.

Figure 9B:
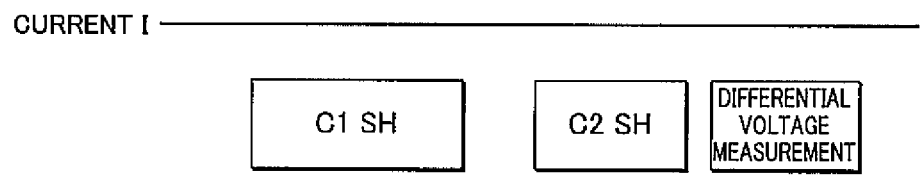
Figure 9C:
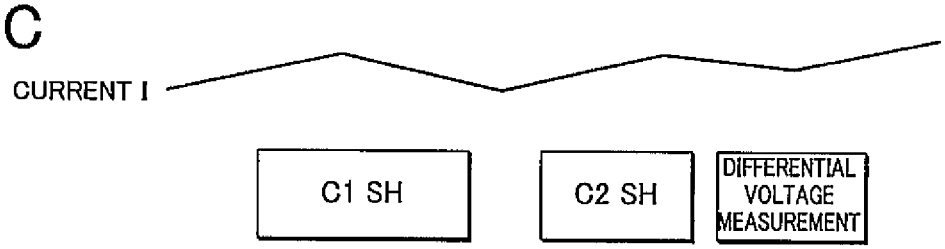

However, in a case where the differential voltage measurement device is mounted in a vehicle, it is not realistic that the current I is changed into the ideal stepwise waveform only to measure the differential voltage during the running. On the other hand, when the differential voltage is measured independently of the state of the current I, the current I may be not changed at the time of the sample and hold operation of the first capacitor C1 and at the time of the sample and hold operation of the second capacitor C2 as illustrated in FIG. 9B, or the current I may be changed at the time of the sample and hold operation as illustrated in FIG. 9C. Therefore, it is not possible to obtain an accurate measurement result.

Figure 10:
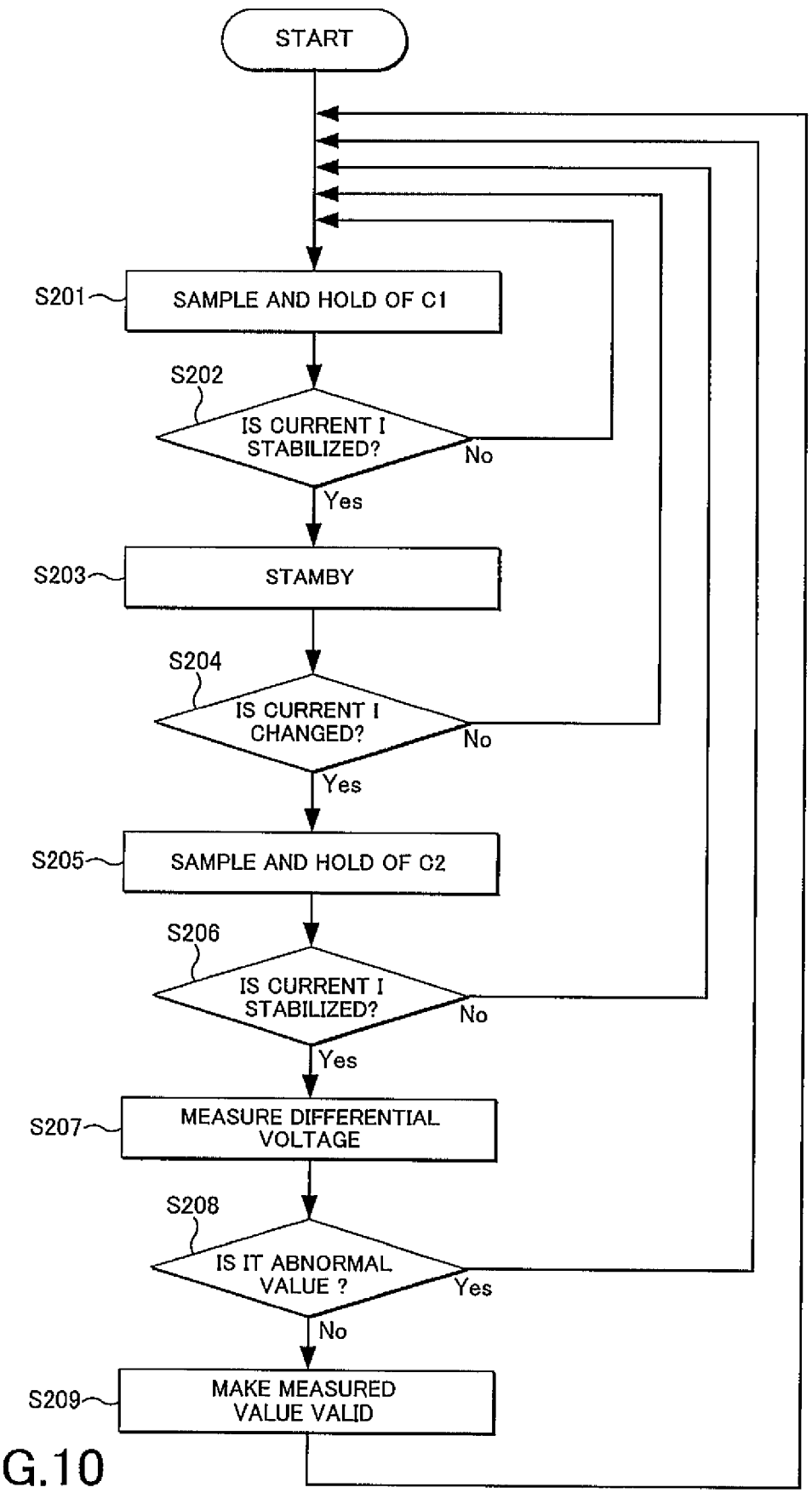
FIG. 10 is a flowchart for describing a third modification of the differential voltage measurement device.

In the third modification of the differential voltage measurement device, the differential voltage is measured according to a procedure illustrated in a flowchart of FIG. 10 in order to obtain an accurate measurement result without forcibly outputting the ideal stepwise waveform. Further, in this process, it is assumed that the current I flowing to the current output unit 220 is always measured.

First, the sample and hold operation of the first capacitor C1 is performed at a predetermined timing (S201). It is determined whether the current I is constant during the sample and hold operation of the first capacitor C1 (S202). In a case where the current I is not constant (S202: No), it is determined that the current is not appropriate, and thus the sample and hold operation (S201) of the first capacitor C1 is performed again.

In a case where the current I is constant during the sample and hold operation of the first capacitor C1 (S202: Yes), the current I at that time is considered as the constant current I1, and the process is on standby for a predetermined time (S203). It is determined whether the current I is changed during the standby (S204). In a case where the current I is not changed (S204: No), it is determined that the current is not appropriate, and thus the sample and hold operation (S201) of the first capacitor C1 and the subsequent steps are performed again.

In a case where the current I is changed during the standby (S204: Yes), the sample and hold operation of the second capacitor C2 is performed at a predetermined timing (S205). It is determined whether the current I is constant during the sample and hold operation of the second capacitor C2 (S206). In a case where the current I is not constant (S206: No), it is determined that the current is not appropriate, and thus the sample and hold operation (S201) of the first capacitor C1 and the subsequent steps are performed again.

In a case where the current I is constant during the sample and hold operation of the second capacitor C2 (S206: Yes), the current I at that time is considered as the constant current I2, and it is determined that the current is appropriate. Therefore, the differential voltage is measured (S207). In a case where the obtained result is not an abnormal value (S208: No), the measured value is considered as valid (S209), and the sample and hold operation (S201) of the first capacitor C1 and the subsequent steps are repeatedly performed as the next measurement.

In a case where the obtained result is an abnormal value (S208: Yes), the measured value is considered as invalid, the sample and hold operation (S201) of the first capacitor C1 and the subsequent steps are performed again. Further, the determination on the abnormal value may be performed such that a normal voltage range of the battery cell Ce is recorded in advance and the measured value is compared with the range.

Since the measured value determined as valid can be considered as the same as that in the ideal stepwise waveform as a result, the measured value can be considered as a normal measured result. Further, a measurement propriety is determined for each process in this procedure. However, the measurement propriety may be collectively determined. For example, after the sample and hold operation of the first capacitor C1 and the sample and hold operation of the second capacitor C2 are performed, the stability of the current I during the sample and hold operation or the change of the current I during the sample and hold operation is determined, so that the measurement propriety may be determined.

Figure 11:
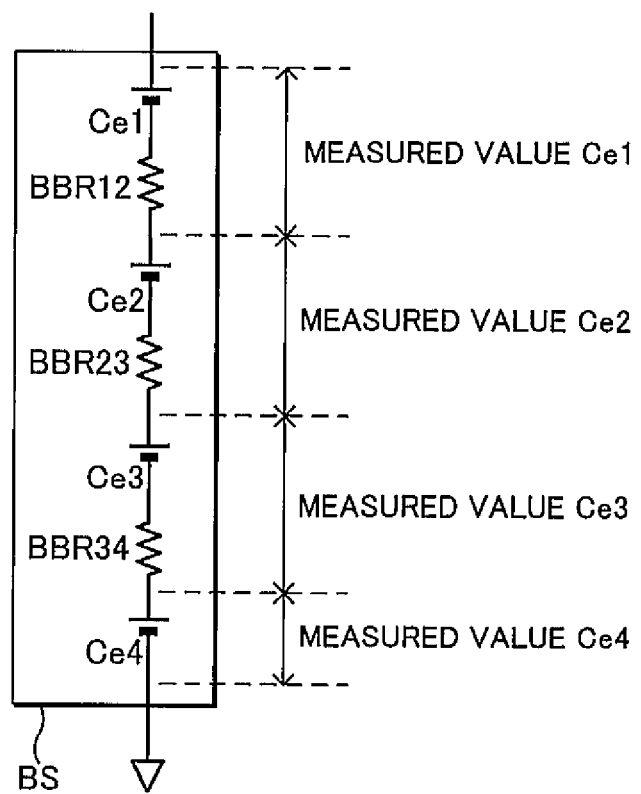
FIG. 11 is a diagram for describing resistance generated by a bus bar connection in a battery pack.
Figure 12:
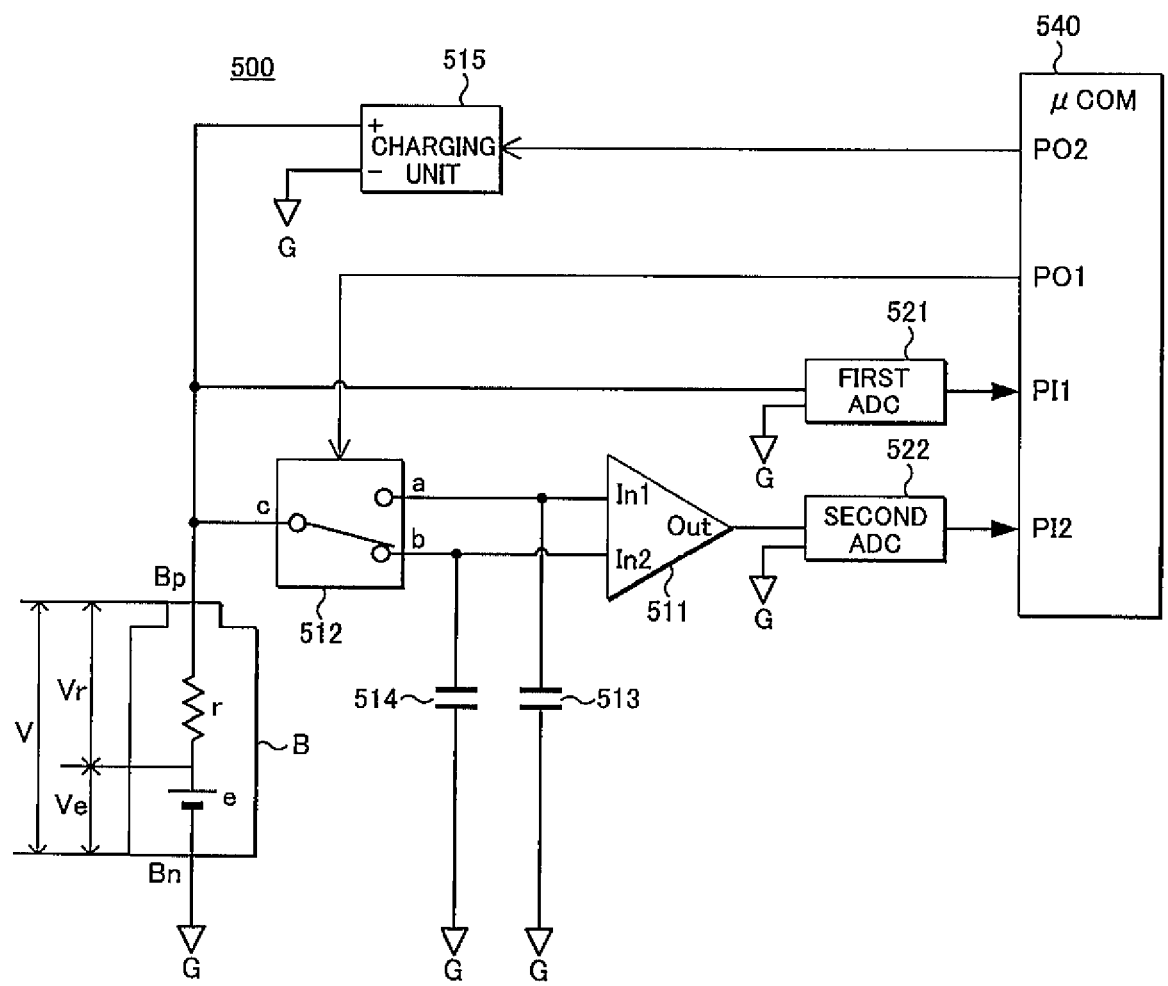
FIG. 12 is a diagram schematically illustrating a configuration of the conventional battery state detection device.

By the way, the respective battery cells Ce are typically connected by a bus bar in the battery pack BS. In the connection through the bus bar, there are slight contact resistance and wiring resistance. Therefore, the battery pack BS has a resistance BBR12 caused by the bus bar connection between the battery cell Ce1 and the battery cell Ce2 as illustrated in FIG. 11. The voltage drop caused by the resistance is contained in the measured voltage value of the battery cell Ce1, and an error occurs. The other battery cells are also the same.

The resistance value caused by the bus bar connection may be acquired in advance by actual measurement. Therefore, the resistance values caused by the bus bar connection between the respective battery cells are recorded in the μCOM 210, and the amount of the voltage drop generated by the current I at the time of measurement is subtracted from the measured voltage value, so that the accuracy in measurement of the differential voltage can be increased still more. In consideration of a secular change, the voltage drop may be calculated by multiplying the recorded resistance value and a predetermined coefficient corresponding to the secular change.

Further, the embodiments including the above modifications are given as merely representative aspects of the invention, and the invention is not limited thereto. In other words, a person skilled in the art may make various changes in a scope not departing from the spirit of the invention on the basis of knowledge of the related art. These changes are also included in the range of the invention as long as the configuration of the differential voltage measurement device of the invention is provided.

REFERENCE SIGNS LIST 100 battery state detection device
111 differential amplification unit
112 changeover switch
113 first capacitor
114 second capacitor
115 charging unit
121 first ADC
122 second ADC
140 μCOM
200 differential voltage measurement device
201 differential voltage measurement device
202 differential voltage measurement device
210 μCOM
211 switch control unit
220 current output unit
230 changeover switch
240 differential amplification unit
250 ADC
261 detection target select switch
262 reference potential setting switch
270 protection switch

What is claimed is:

1. A differential voltage measurement device, comprising:
a first capacitor;
a second capacitor of which the capacity is smaller than that of the first capacitor;
a differential amplification unit for outputting a voltage according to a differential voltage between a voltage held in the first capacitor and a voltage held in the second capacitor; and
a control unit guiding a first voltage to the first capacitor, and guiding a second voltage to the second capacitor in a state where the first capacitor holds the first voltage;
a protection switch switching a connection state of the differential amplification unit with respect to the first capacitor and the second capacitor; and
a temperature sensor, wherein
the control unit is configured to
change a waiting time based on a measured value of the temperature sensor such that voltage drops of the first capacitor and the second capacitor correspond at the waiting time and the measured value,
disconnect the protection switch during guiding the first voltage to the first capacitor and guiding in a state of the first capacitor holding the first voltage the second voltage to the second capacitor, and
connect the protection switch after guiding the second voltage to the second capacitor and waiting the waiting time.

2. The differential voltage measurement device according to claim 1, further comprising:

a changeover switch switching a connection destination of an input terminal to which a voltage is input, exclusively to the first capacitor or to the second capacitor,
wherein the control unit controls the changeover switch to guide the first voltage to the first capacitor and to guide the second voltage to the second capacitor in a state where the first capacitor holds the first voltage.

3. The differential voltage measurement device according to claim 2, further comprising:
a leakage current prevention switch switching a connection state of an opposite side of a connection side of the changeover switch of the first capacitor is changed,
wherein the control unit switches the leakage current prevention switch to a disconnected state during a period when the second voltage is guided to the second capacitor in a state where the first capacitor holds the first voltage.

4. The differential voltage measurement device according to claim 2, further comprising:
a current output unit switching and outputting a first current to be supplied for generating the first voltage and a second current to be supplied for generating the second voltage.

5. The differential voltage measurement device according to claim 3, further
comprising: a current output unit switching and outputting a first current to be supplied for generating the first voltage and a second current to be supplied for generating the second voltage.

6. The differential voltage measurement device according to claim 1, further comprising:
a current output unit switching and outputting a first current to be supplied for generating the first voltage and a second current to be supplied for generating the second voltage.

7. The differential voltage measurement device according to claim 1,
wherein the control unit is configured to
acquire a current value for generating the first voltage and the second voltage, and
nullify an output result of the differential amplification unit in any one of the following cases
1) the current value acquired during a period when the first voltage is guided to the first capacitor is changed,
2) the current value is not changed, acquired until the second voltage is guided to the second capacitor after the first voltage is guided to the first capacitor, and
3) a current value is changed, acquired during a period when the second voltage is guided to the second capacitor.

8. The differential voltage measurement device according to claim 1,
wherein the control unit corrects an output result of the differential amplification unit on the basis of a predetermined resistance value related to an internal connection of a supply source of the first voltage and the second voltage.

* * * * *